United States Patent
Vinson

(10) Patent No.: US 7,906,812 B2
(45) Date of Patent: Mar. 15, 2011

(54) TUNABLE VOLTAGE ISOLATION GROUND TO GROUND ESD CLAMP

(75) Inventor: James E. Vinson, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/893,271

(22) Filed: Sep. 29, 2010

(65) Prior Publication Data

US 2011/0019317 A1 Jan. 27, 2011

Related U.S. Application Data

(60) Continuation of application No. 12/687,621, filed on Jan. 14, 2010, now Pat. No. 7,825,429, which is a division of application No. 12/049,992, filed on Mar. 17, 2008, now Pat. No. 7,663,190.

(60) Provisional application No. 60/978,371, filed on Oct. 8, 2007.

(51) Int. Cl.
*H01L 23/62* (2006.01)

(52) U.S. Cl. .. 257/355; 257/121; 257/157; 257/E23.002

(58) Field of Classification Search ................ 257/121, 257/157, 377, E23.002
See application file for complete search history.

(56) References Cited

U.S. PATENT DOCUMENTS

| | | | |
|---|---|---|---|
| 6,011,681 | A | 1/2000 | Ker et al. |
| 6,258,634 | B1 | 7/2001 | Wang et al. |
| 6,469,353 | B1 | 10/2002 | Amerasekera |
| 6,825,644 | B2 | 11/2004 | Kernahan |
| 6,933,540 | B2 | 8/2005 | Liu |
| 7,243,317 | B2 * | 7/2007 | Wang et al. ............ 716/112 |
| 2002/0017654 | A1 | 2/2002 | Lee et al. |
| 2002/0079538 | A1 | 6/2002 | Su |
| 2004/0084730 | A1 | 5/2004 | Morishita |
| 2005/0151160 | A1 | 7/2005 | Salcedo |
| 2007/0029981 | A1 | 2/2007 | Johnson et al. |

* cited by examiner

*Primary Examiner* — Trung Dang
(74) *Attorney, Agent, or Firm* — Fogg & Powers LLC

(57) ABSTRACT

A tunable voltage isolation ground to ground ESD clamp is provided. The clamp includes a dual-direction silicon controlled rectifier (SCR) and trigger elements. The SCR is coupled between first and second grounds. The trigger elements are also coupled between the first and second grounds. Moreover, the trigger elements are configured to provide a trigger current to the dual-direction silicon controlled rectifier when a desired voltage between the first and second grounds is reached.

14 Claims, 7 Drawing Sheets

TUNABLE VOLTAGE ISOLATION GROUND TO GROUND ESD CLAMP

CROSS-REFERENCE TO RELATED APPLICATIONS

This application is a continuation of U.S. application Ser. No. 12/687,621 filed on Jan. 14, 2010, which is a divisional of U.S. application Ser. No. 12/049,992 filed on Mar. 17, 2008, which claims the benefit of U.S. Provisional Application No. 60/978,371 filed on Oct. 8, 2007, all of which are incorporated by reference herein.

BACKGROUND

Power management parts typically have at least two power domains: analog and power. The analog domain is generally free of noise while the power domain, by definition, will have a lot of noise from the switching transistors (inductive transients).

Proper Electrostatic Discharge (ESD) protection for integrated circuits (ICs), such as power management parts, requires a defined current path between each pin combination. This requirement poses problems from a circuit design perspective when it is desired to keep the noisy switching power domain separate from the quiet analog domain. The supplies may be at different potentials (i.e. 5 V and 12 V) making coupling the power domains difficult.

The simplest solution, since both grounds are at zero volts, is to put anti-parallel diodes between the two grounds thereby tying the two domains together. This separates the grounds by a diode drop and the diode capacitance. Since transients, switching noise, on the power domain may exceed 3 volts, a single diode drop of 0.7 V will not provide adequate isolation so additional diodes may be needed. However, with each added diode the series resistance increases from an ESD perspective. If the resistance is kept the same, the diodes would have to be Nx in size for N diodes in series. To achieve 3 volt isolation with the anti-parallel diode solution, it would require approximately 5 to 6 diodes in series. This would result in an extremely large ESD protection structure, which would make it undesirable for most applications.

Another possible protection scheme is to provide cross coupled clamps between the two power domains. This has been used and does provide good ground to ground isolation but in effect doubles the number of clamps that are required to achieve optimum protection. For a circuit with many power domains this could become prohibitive since each quiet power domain would have to be coupled to each noisy domain. Another drawback with this approach is that the noise on the noisy domain could falsely trigger the ESD clamps required in the cross coupling resulting in an electrical overstress (EOS) event damaging the circuit in question.

For the reasons stated above and for other reasons stated below which will become apparent to those skilled in the art upon reading and understanding the present specification, there is a need in the art for an effective and efficient ESD clamp that uses a relatively small footprint.

SUMMARY OF INVENTION

The above-mentioned problems of current systems are addressed by embodiments of the present invention and will be understood by reading and studying the following specification. The following summary is made by way of example and not by way of limitation. It is merely provided to aid the reader in understanding some of the aspects of the invention.

In one embodiment, a tunable voltage isolation ground to ground ESD clamp is provided. The clamp includes a dual-direction silicon controlled rectifier (SCR) and trigger elements. The SCR is coupled between first and second grounds. The trigger elements are also coupled between the first and second grounds. Moreover, the trigger elements are configured to provide a trigger current to the dual-direction silicon controlled rectifier when a desired voltage between the first and second grounds is reached.

BRIEF DESCRIPTION OF THE DRAWINGS

The present invention can be more easily understood and further advantages and uses thereof more readily apparent, when considered in view of the detailed description and the following figures in which.

In accordance with common practice, the various described features are not drawn to scale but are drawn to emphasize specific features relevant to the present invention. Like reference characters denote like elements throughout the Figures and text.

DETAILED DESCRIPTION

In the following detailed description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention provide a single element between the grounds that provides both a high and adjustable isolation voltage during circuit operation and a low resistance/low voltage path under an ESD transient event. This is accomplished in embodiments of a tunable voltage isolation ground-to-ground ESD clamp by integrating a dual-direction silicon controlled rectifier (triac or SCR) with the proper trigger elements tied between the power domains (or grounds) into the clamp. The ESD clamps of embodiments are tunable by what is used to trigger the SCR. Two examples of trigger elements include a stack of diodes connected in series and zener diodes where the breakdown of the zener junction is controlled.

Figure 1:
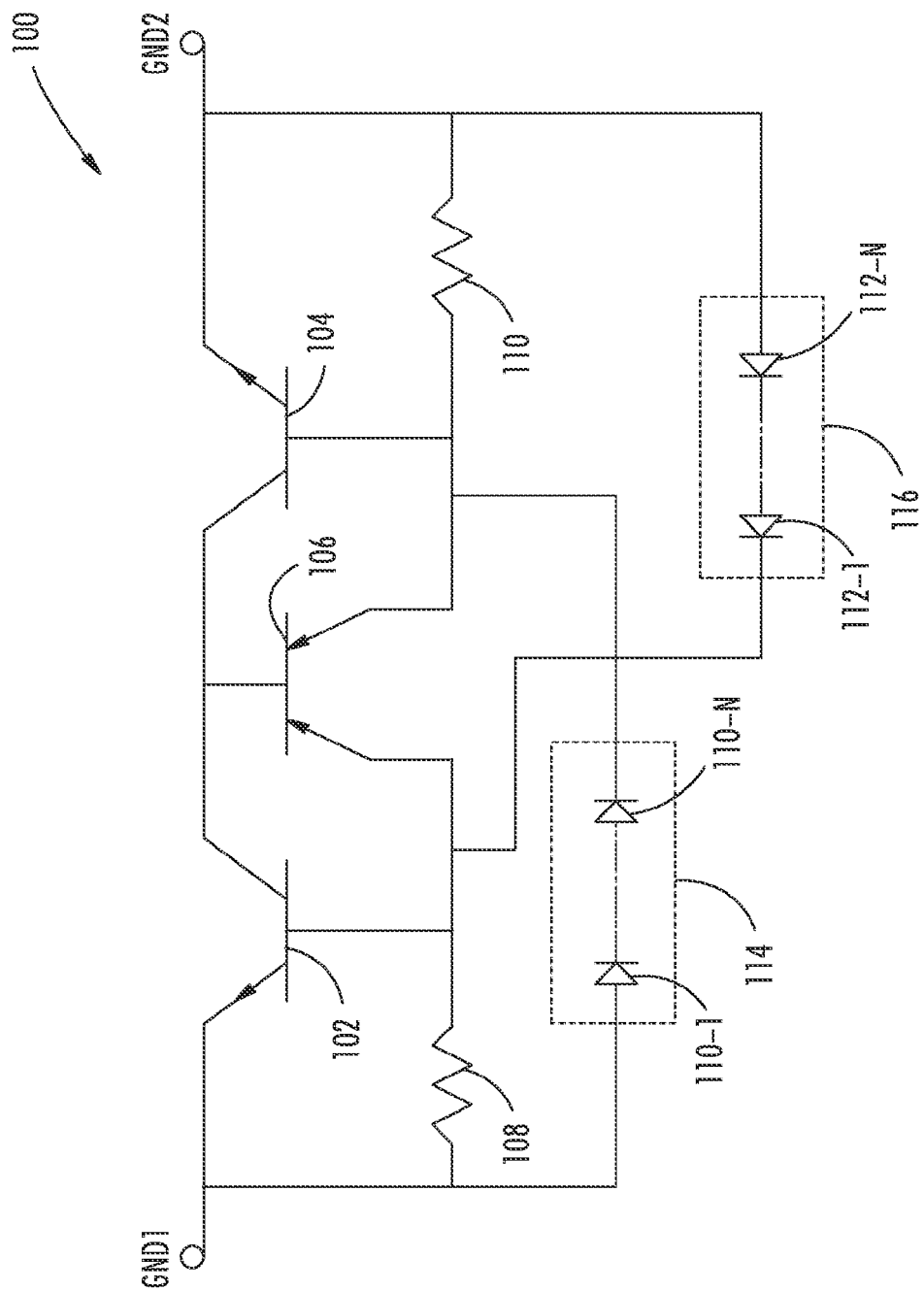
FIG. 1 is a schematic diagram of an ESD clamp of one embodiment of the present invention.

Referring to FIG. 1, a schematic diagram of one embodiment of a tunable voltage isolation ground clamp 100 is illustrated. As illustrated, the ground clamp 100 includes transistors 102, 104, 106, resistors 108, 110, and trigger elements 114, 116. A dual-direction SCR is made from transistors 102, 104, 106, and resistors 108, 110. In the embodiment of FIG. 1, the trigger elements 114 and 116 each comprise a series of diodes 110 (1-N) and 112 (1-N). However, the trigger elements 114 and 116 could be any appropriate element that provides a trigger current when the desired voltage is reached. The desired voltage is the trigger voltage used to turn on the SCR. This is driven by the amount of isolation used (i.e., 1, 2, 3, 4 or 5 V of ground to ground isolation). In operation, once the trigger elements 114 and 116 allow enough current to flow in the base/emitter junction of one or both of the bipolar transistors 102 and/or 104 to fully turn them on, the transistors 102 and/or 104 inject causing transistor 106 to turn on completing a self generation circuit. Further, in some embodiments, multiple layout versions are designed to optimize the trigger current, holding voltage and dynamic on resistance.

Figure 2A:
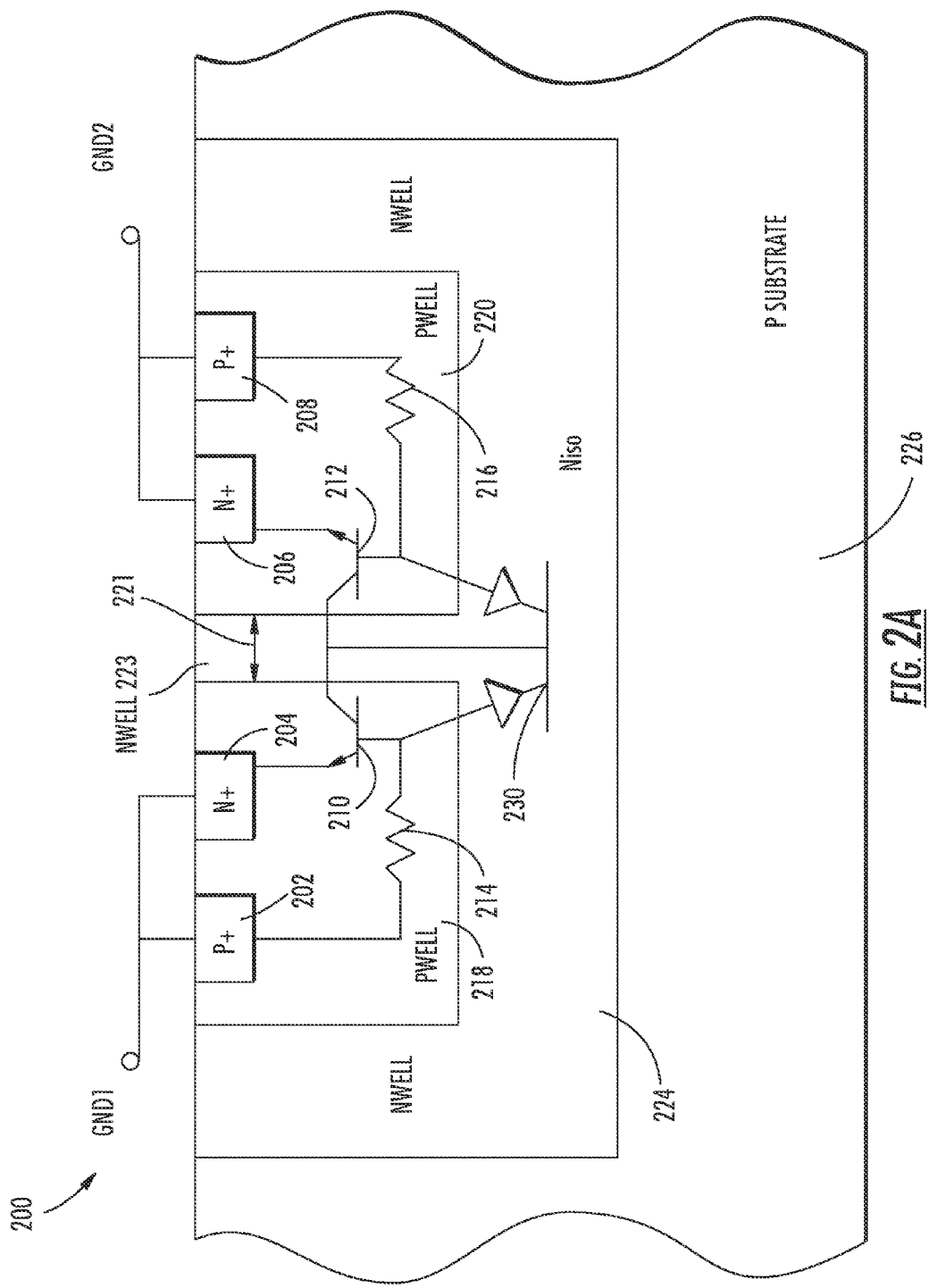
FIG. 2A is a cross-sectional illustration of a dual direction SCR clamp of one embodiment of the invention.
Figure 2B:
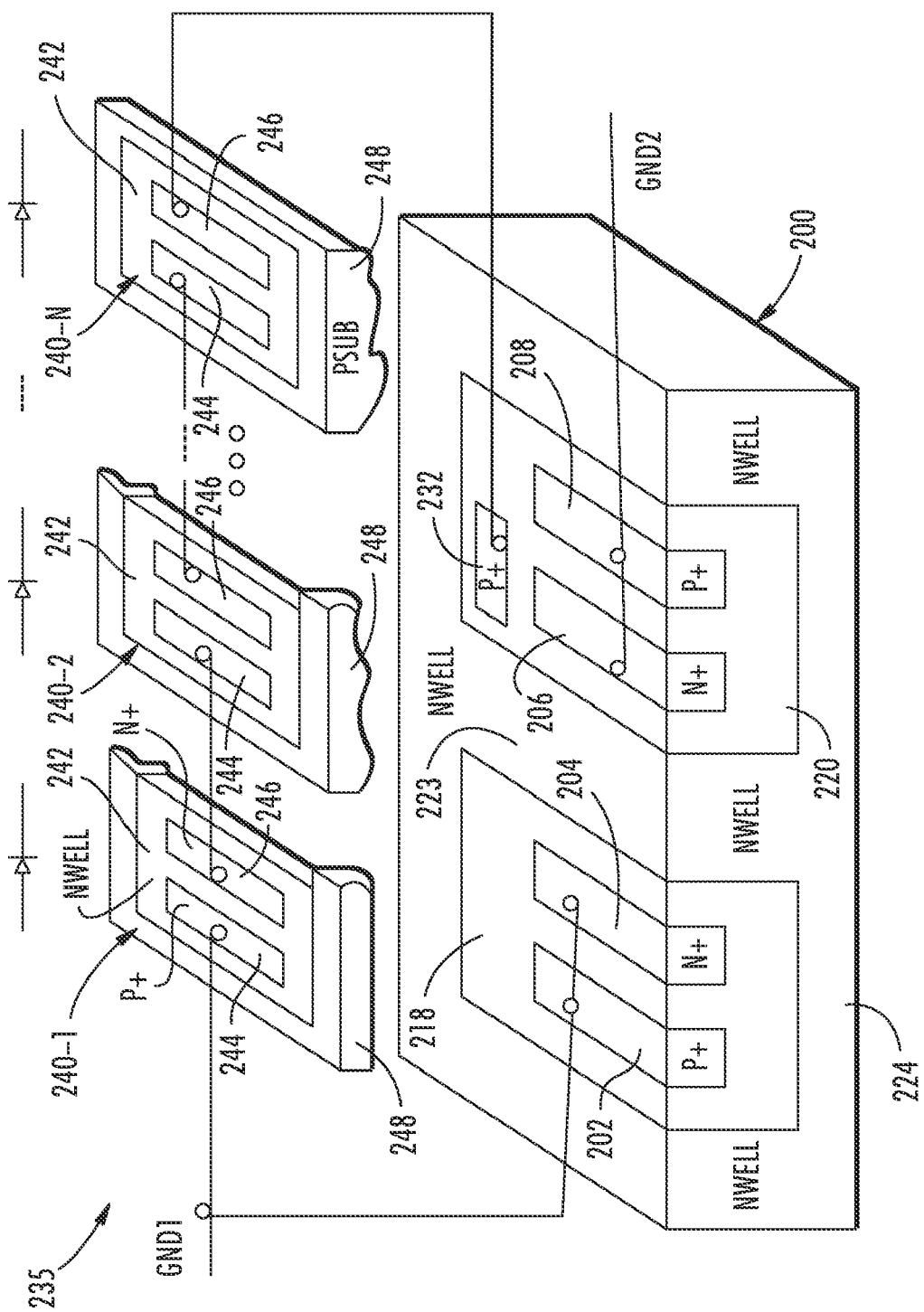
FIG. 2B is a cross-sectional illustration of the dual direction SCR clamp of FIG. 2A coupled to trigger elements of one embodiment of the present invention.

An example of an illustration of a structure of one embodiment of tunable voltage isolation ground clamp 235 is illustrated in FIGS. 2A and 2B. In particular, FIG. 2A illustrates a partial cross-sectional view of a dual-direction SCR 200 of FIG. 1 without the trigger elements and FIG. 2B includes trigger elements 240 (1-N). As illustrated in FIG. 2A, a dual-direction SCR 200 includes two Pwells 218 and 220 separated by an Nwell/Niso 224. The Nwell/Niso 224 is formed in a P substrate 226. As illustrated, the structure is isolated from the substrate 226 by the N-type isolation region 224. Each Pwell 218 and 220 has a P+ well tie 202 and 208 respectively and an N+ cathode region 204 and 206 respectively.

The dual-direction SCR 200 of FIG. 2A includes a first and a second SCR. The first SCR is formed by N+ region 204, Pwell 218, Nwell 224, and Pwell 220. This SCR includes NPN transistor 210 and the PNP transistor 230. The second SCR is formed by N+ region 206, Pwell 220, Nwell 224, and Pwell 218. This SCR includes NPN transistor 212 and the PNP transistor 230. The Pwells 218 and 220 form resistances indicated by resistors 214 and 216 respectively, that are used to develop a voltage drop across the base (Pwell)/emitter (N+) of the NPN transistors.

Once sufficient current flows in the base/emitter junction of the transistors 210 and/or 212 to turn them on, the clamp 235 will trigger from a blocking state into a low conductive state (an "on" state). The holding voltage, dynamic resistance, and trigger current are defined by the spacing between the various layers that form the dual-direction SCR 200. In particular, the holding voltage is the minimum voltage required to maintain the dual-direction SCR 200 in its on state. It is defined by a gain and collector resistance of the bipolar transistors that form the dual-direction SCR 200. The spacing 221 between the two Pwells 218 and 220 is where the Nwell 223 is formed. This width 221 is the base width of the PNP transistor 230 and is also the collector resistance of the two NPN transistors 210 and 212. The dynamic resistance is the differential resistance of the dual-direction SCR 200 while it is in the on state and the trigger current is the minimum current required to trigger the dual-direction SCR 200 into its on state. The range of these spacing are used to optimize the device for Ground to Ground protection.

In FIG. 2B only one set of trigger elements 240 (1-N) are illustrated. As illustrated, the trigger elements 240 (1-N) are connected to Pwell 220 via P+ contact 232 to build up the base/emitter voltage of the NPN transistor once the selected voltage is reached. The other set of trigger elements (not shown) would be coupled similarly to Pwell 218. As illustrated in FIG. 2B, each trigger element 240 includes a P+ region 244 and a N+ region 246 formed in a Nwell 242. The Nwell 242 is formed in a Psub 248 that isolates the diode from the dual-direction SCR 200. As discussed above, the clamp 235 is tunable by varying the number of the trigger elements 140 (1-N) used.

Figure 3:
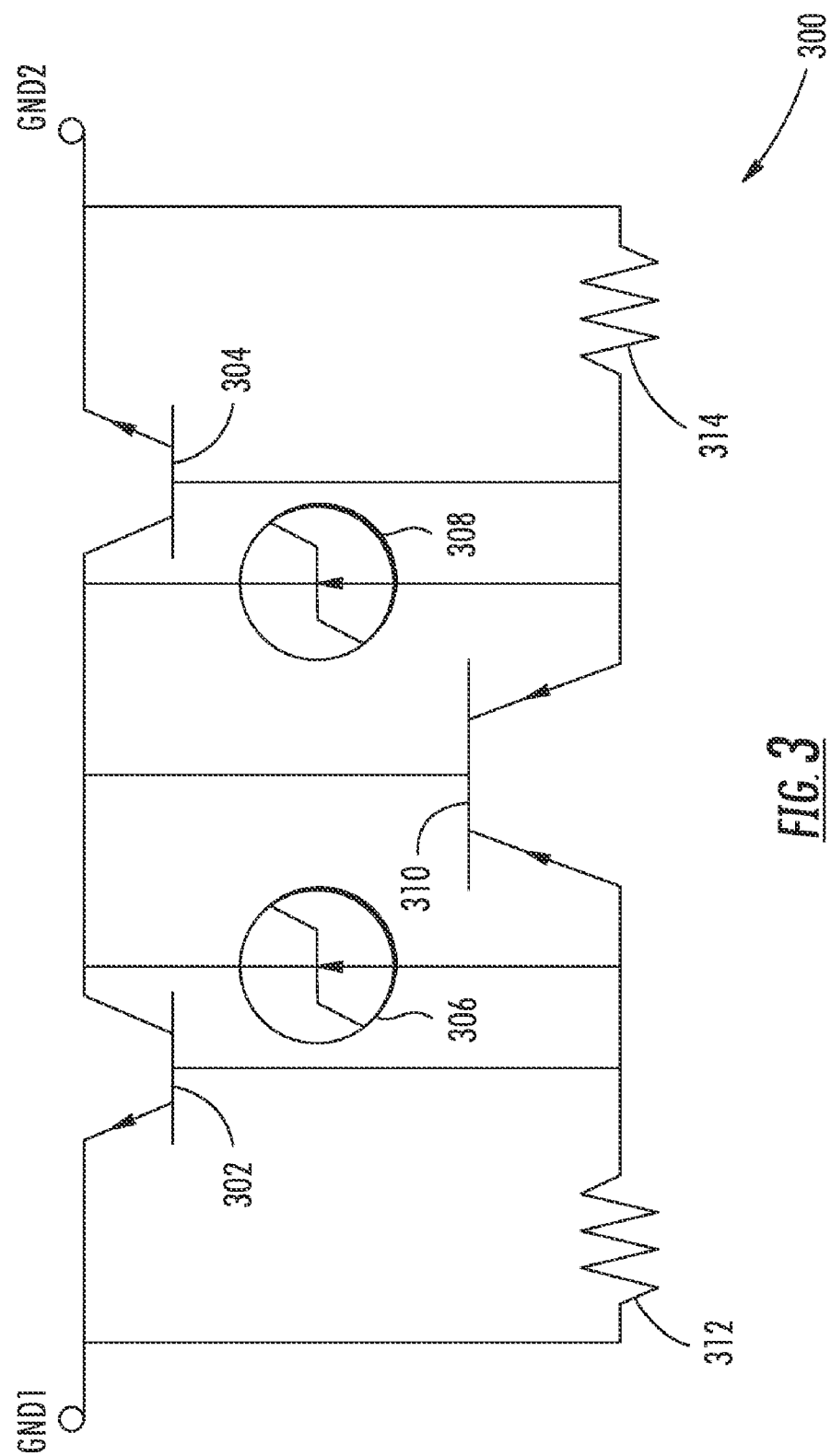
FIG. 3 is a schematic diagram of a low voltage dual SCR clamp with embedded zener diodes of another embodiment of the present invention.

FIG. 3 illustrates a schematic diagram of a tunable voltage isolation ground clamp 300 of another embodiment of the present invention. In this embodiment, trigger junction zener diodes 306 and 308 are used. Zener diodes 306 and 308 breakdown at a specific voltage. When the breakdown voltage is reached, they supply the base current that is required to turn on the SCR. The tunable voltage isolation ground clamp 300 also includes NPN transistors 302 and 304, a PNP transistor 310 and resistors 312 and 314 as illustrated.

Figure 4:
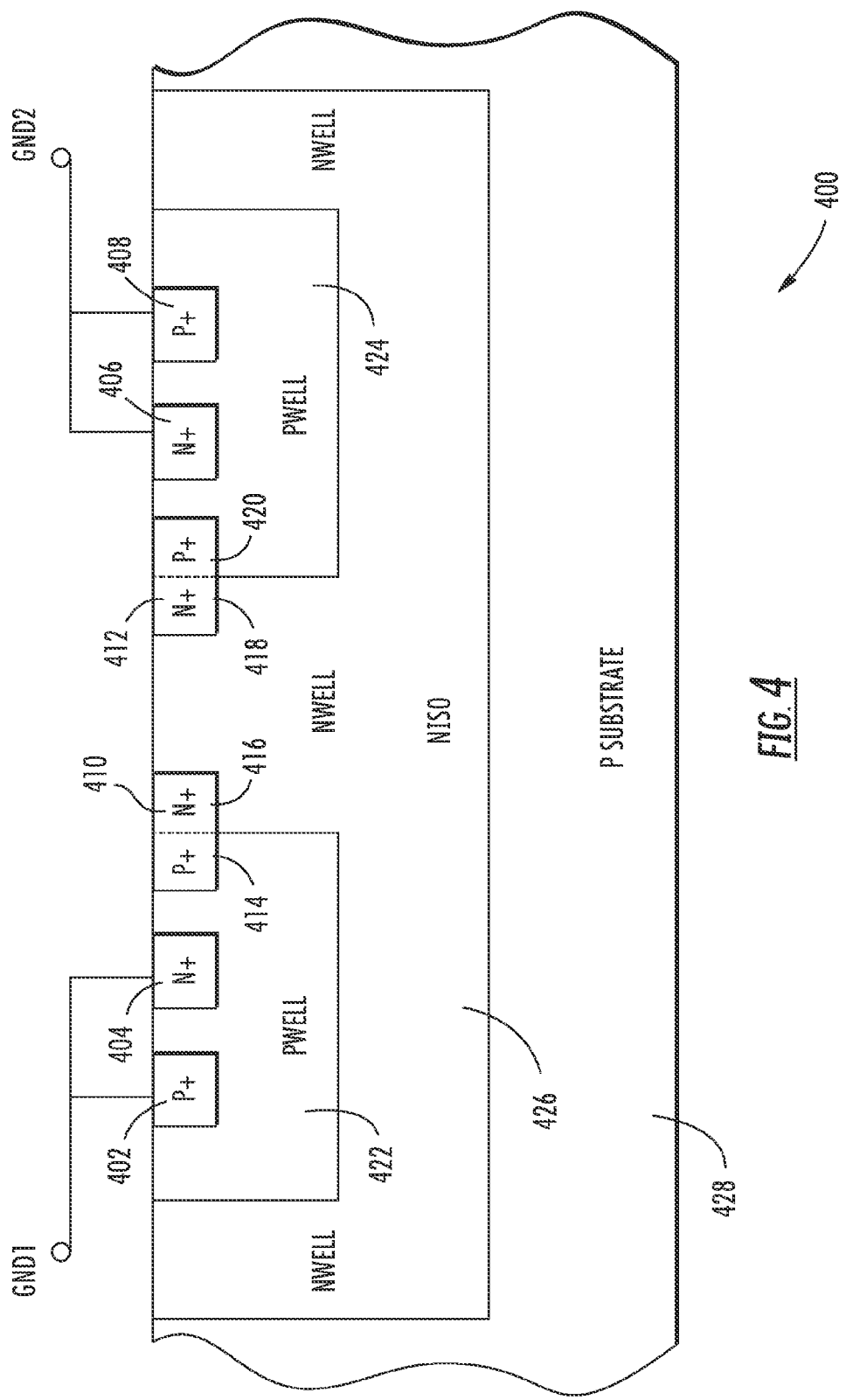
FIG. 4 is a cross-sectional illustration of an ESD clamp from the schematic of FIG. 3.

FIG. 4 illustrates a tunable voltage isolation ground clamp 400 formed in a substrate 428 of one embodiment of the schematic diagram illustrated in FIG. 3. In the embodiment of FIG. 4, overlapping N+/P+ regions 414, 416 and 418, 420 at the Nwell/Pwell 426, 422 and 424 edges are used to initiate triggering. These are the zener diodes of FIG. 3. As also illustrated in FIG. 4, the ground clamp 400 also includes Pwells 422 and 424 formed in Nwell 426. Each Pwell 422 and 424 has a P+ well tie 402 and 408, respectively, and an N+ cathode region 404 and 406, respectively. The NPN transistors 302 and 308 of FIG. 3 are formed by N+ cathode region 404, Pwell 422, and Nwell 426, and N+ cathode region 406, Pwell 424, and Nwell 426, respectively. The PNP transistor 310 of FIG. 3 consists of the two Pwells 422 and 424 separated by Nwell 426 of FIG. 4. The Nwell 426 is formed in P substrate 428. The Pwells 422 and 424 form resistances indicated by resistors 312 and 314, respectively, which are used to develop a voltage drop across the Base (Pwell)/emitter (N+) of the NPN transistors 310.

A voltage difference develops between the two grounds (GND1 positive with respect to GND2). The voltage of the P+ (402), PWELL (422) increase forward biasing of the Zener diode (414) thereby biasing the NWELL (426). The voltage increases until the Zener diode (412) breaks down injecting current into the PWELL (424). Once this occurs, current flows through the PWELL (424) wherein a voltage is developed in the PWELL (424) resistance. Once this voltage reaches ~0.7 v, the NPN formed by the NWELL/PWELL (424)/N+ (406) turns on. This in turn, turns on the SCR, switching it from the blocking state to the conductive (on state). In a similar manner, a positive voltage on GND2 would initiate turn-on of the NPN transistor formed by the NWELL/PWELL (422)/N+ (404) transistor. Once sufficient current flows, the clamp will trigger going into a low conductive state.

Figure 5:
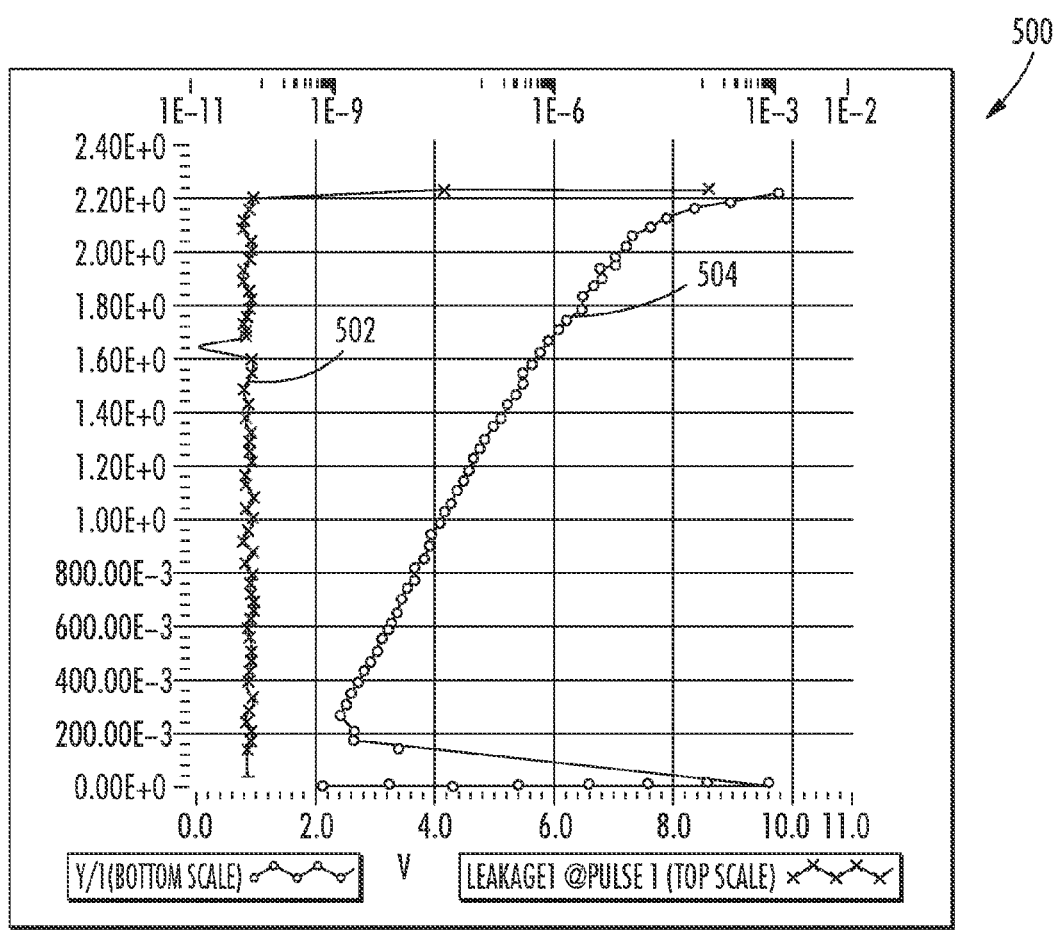
FIG. 5 is a transmission line pulse graph illustrating ground to ground protection of one embodiment of the present invention.

Referring to FIG. 5, a Transmission Line Pulse (TLP) graph 500 that shows the result of a tunable clamp of one embodiment is illustrated. The units of measure of the TLP graph 500 include voltage in volts along the bottom axis, current in amps along the side axis and current in amps along the top axis. In creating the TLP graph, a rectangle current pulse is forced into the device and the resulting voltage on the device is measured. The voltage and current are represented by the circles that make up the V/I characteristic curve 504 for the ESD element. The voltage and current are indicated by the voltage scale along the bottom axis and the current scale along the side axis of the graph. After each current pulse, a current leakage measurement is taken to monitor if the device has failed. The current leakage measurement tells how much current is flowing in a normal operation like in power up. The results of the current leakage measurements are indicated by x's on the TPL graph 500, which make a current leakage curve 502. The current scale of the x's on the current leakage curve 502 is indicated on the top axis. Every circle that is representative of the voltage and current measured by the TLP system has an associated x. Hence, every circle, that represents a pulse from the TLP system, has an associated x that defines what the leakage was as a result of the pulse. As discussed above, the current leakage curve 502 is the leakage current across the device being tested. In this example as illustrated, a SCR is triggered at about 9.6 volts. The slope of the characteristic curve 504 between 300 milliamps to about 1.6 amps is basically the linear resistance of the SCR once it is triggered. That is, it is the dynamic resistance of the SCR. Moreover, in this example, the device finally fails at about 2.2 amps. In embodiments, the characteristics of the device can be changed by changing the number of stripes used to form the SCR and by changing the size of the SCR. Hence, the device can be made to carry more current just by increasing the size of the SCR.

Figure 6:
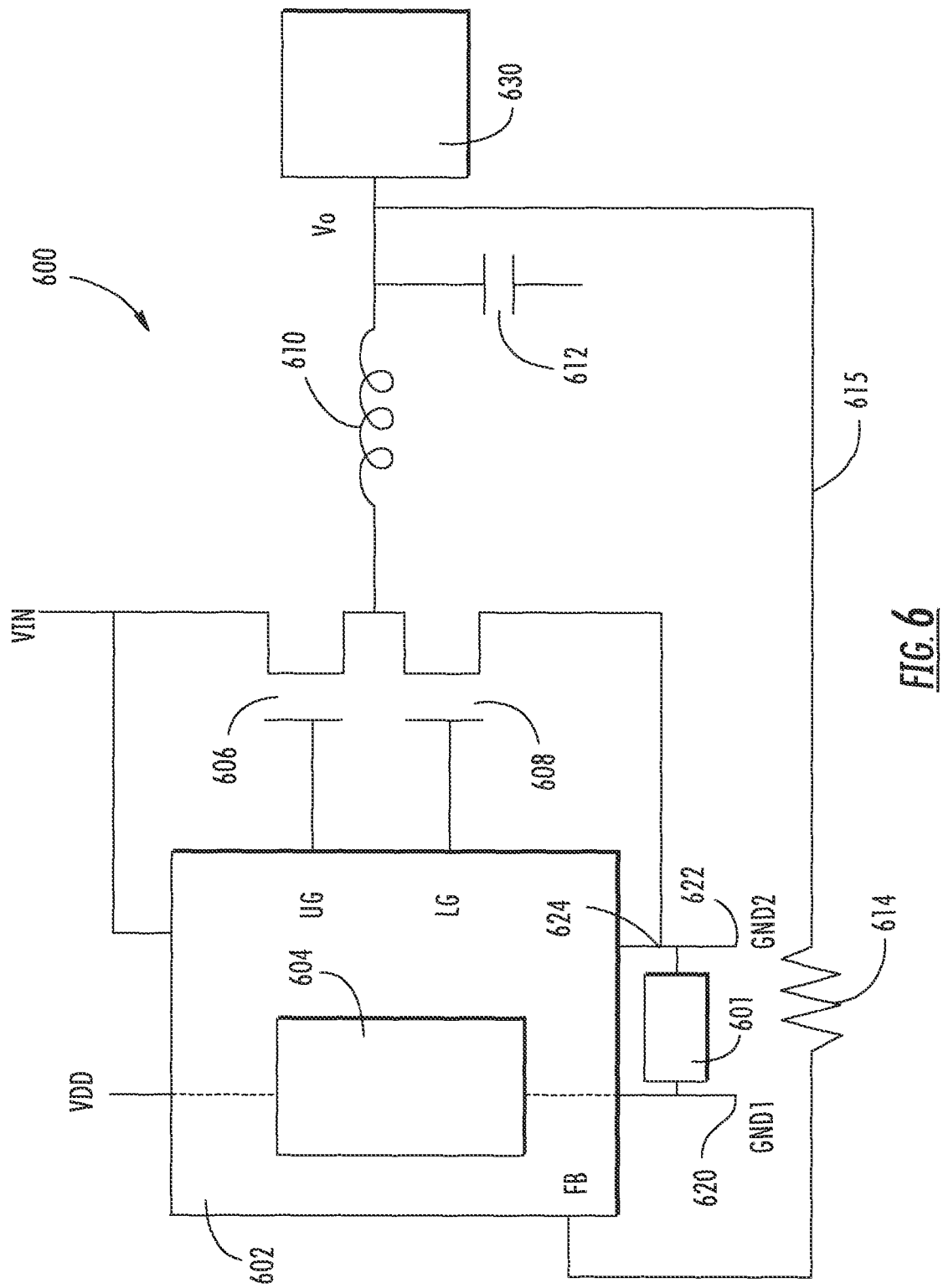
FIG. 6 is a switching power regulator of one embodiment of the present invention.

FIG. 6 illustrates a switching power regulator 600 of one embodiment of the present invention. As illustrated, the switching power regulator 600 includes a regulator 602, a first and second switch 606 and 608, an inductor 610, an output capacitor 612, and a resistor 614 in a feedback loop 615. The regulator 602 includes control circuit 604. Also illustrated in this example are a first ground 620 and a second ground 622. In this embodiment, the second ground 622 is coupled to a noisy switching node 624. The first ground 620 is coupled to the control circuit 604 in the regulator 602. In this type of arrangement, noises coupled between the first and second grounds 620 and 622 can affect the control circuit 604 of the regulator 602, producing errors in operation. Therefore, the switching power regulator 600 of this embodiment also includes a tunable voltage isolation ground clamp 601 such as those described above in regards to embodiments illustrated in FIGS. 1 to 4. As illustrated in FIG. 6, Vo is coupled to an electronic device 630 such as a microprocessor, etc.

The tunable voltage isolation ground clamp 601 of FIG. 6 provides voltage isolation between the noisy power ground 622 of the switching nodes 606, 608, 610, and 612 and the quiet ground 620 of the control circuit 604. The noisy power ground 622 could have voltage swings in excess of 5 v that would be coupled into the quiet ground 620 if the voltage isolation ground clamp 601 were not in place. The control circuit 604 includes sensitive analog circuits that control the switching of the power FETS 606 and 608 to properly regulate the output voltage, Vo. These components include voltage references, comparators, and operational amplifiers. The proper operation of these components relies on a very stable ground reference. If the power domain noise was coupled into the control circuit ground 620, the operation of these components would become erratic and depend on the switching noise. These noise transients would affect the operation of the control circuit 604, causing it to fail and resulting in the entire regulator not working properly.

Although specific embodiments have been illustrated and described herein, it will be appreciated by those of ordinary skill in the art that any arrangement, which is calculated to achieve the same purpose, may be substituted for the specific embodiment shown. The claims are intended to cover any adaptations or variations of the present invention. Therefore, it is manifestly intended that this invention be limited only by the claims and the equivalents thereof.

What is claimed is:

1. A tunable voltage isolation node to node electrostatic discharge clamp, the clamp comprising:
    a substrate;
    a dual-direction silicon controlled rectifier (SCR) isolated from the substrate coupled between a first voltage potential and a second voltage potential; and
    trigger elements coupled between the first and second voltage potentials, the trigger elements configured to provide a trigger current to the dual-direction SCR when a desired voltage between the first and second voltage potentials is reached.

2. The clamp of claim 1, wherein the first voltage potential is a first ground and the second voltage potential is a second ground.

3. A tunable voltage isolation node to node electrostatic discharge clamp, the clamp comprising:
    a first voltage node;
    a second voltage node;
    a dual-direction silicon controlled rectifier (SCR) coupled between the first voltage node and the second voltage node; and
    trigger elements coupled between the first and second voltage node, the trigger elements configured to provide a trigger current to the dual-direction SCR when a desired voltage between the first and second voltage nodes is reached.

4. The clamp of claim 3, further comprising:
    a substrate; and
    wherein the dual-direction SCR is isolated from the substrate.

5. The clamp of claim 4, wherein the first voltage node is a first ground and the second voltage node is a second ground.

6. The clamp of claim 4, further configured to provide electrostatic discharge (ESD) protection.

7. The clamp of claim 4, wherein the first voltage node is a first voltage potential and the second voltage node is a second voltage potential.

8. The clamp of claim 4, wherein the first voltage node is an analog ground and the second voltage node is a digital ground.

9. An electronic device comprising:
    a microprocessor;
    a switching regulator, coupled to the microprocessor, the switching regulator including:
        at least one switch;
        a regulator including control functions configured to operate the at least one switch;
        an inductor coupled between the at least one switch and an output node;
        a feedback loop coupled between the output node and the regulator, wherein the regulator switches the at least one switch at a rate based at least in part on the feedback loop;
        a first voltage node coupled to the control function; and
        a second voltage node coupled to the at least one switch; and
    a tunable voltage isolation node to node electrostatic discharge clamp coupled between the first and second voltage nodes, the clamp including:
        a substrate;
        a dual-direction silicon controlled rectifier (SCR) isolated from the substrate coupled between the first and second voltage nodes; and
        trigger elements coupled between the first and second voltage nodes, the trigger elements configured to provide a trigger current to the dual-direction SCR when a desired voltage between the first and second voltage nodes is reached.

10. The electronic device of claim 9, wherein the dual-direction SCR further comprises:
   a first SCR comprising:
      a first well of a first conductivity type located in a second well of a second conductivity type;
      a first region of the second conductivity type with high dopant concentration located in the first well of the first conductivity type; and
      a third well of the first conductivity type located a select distance from the first well of the first conductivity type in the second well of the second conductivity type; and
   a second SCR comprising:
      the third well of the first conductivity type;
      a second region of the second conductivity type with high dopant concentrations located in the third well of the first conductivity type, and
      the first well of the first conductivity type.

11. The electronic device of claim 10, wherein the trigger elements further comprise:
   a first overlapping region including a first section within the first well having a high dopant concentration of the first type and a second section outside the first well having a high dopant concentration of the second type; and
   a second overlapping region including a first section within the third well having a high dopant concentration of the first type and a second section outside the third well having a high dopant concentration of the second type.

12. The electronic device of claim 10, wherein spacing of the first and third wells, and the regions, define at least one of a holding voltage, a dynamic resistance, and trigger current.

13. The electronic device of claim 10, wherein the dual-direction SCR further comprises:
   a first transistor of a first type;
   a second transistor of a second type, the second transistor having an emitter coupled to the first voltage node and a collector coupled to a base of the first transistor, the second transistor further having a base coupled to the second voltage node across a first of the trigger elements, the base of the second transistor further coupled to a first emitter of the first transistor; and
   a third transistor of the second type, having an emitter coupled to the second voltage node and a collector coupled to the base of the first transistor, the third transistor further having a base coupled to the first voltage node across a second of the trigger elements, the base of the third transistor further coupled to a second emitter of the first transistor.

14. The electronic device of claim 13, wherein each of the second and third transistors further comprises:
   a first well of the first conductivity type located in a second well of the second conductivity type, the second well located in a substrate of the first conductivity type.

* * * * *